US009553010B2

United States Patent
Naor

(10) Patent No.: US 9,553,010 B2
(45) Date of Patent: Jan. 24, 2017

(54) WAFER GRIPPER WITH NON-CONTACT SUPPORT PLATFORM

(71) Applicant: Coreflow Ltd, Daliat el Carmel (IL)

(72) Inventor: Isaac Naor, Hod-HaSharon (IL)

(73) Assignee: Coreflow Ltd., Yokneam Elite (IL)

( * ) Notice: Subject to any disclaimer, the term of this patent is extended or adjusted under 35 U.S.C. 154(b) by 33 days.

(21) Appl. No.: 14/749,638

(22) Filed: Jun. 25, 2015

(65) Prior Publication Data
US 2016/0379863 A1    Dec. 29, 2016

(51) Int. Cl.
| | | |
|---|---|---|
| *H01L 21/683* | (2006.01) | |
| *B25J 15/00* | (2006.01) | |
| *B25J 15/06* | (2006.01) | |
| *H01L 21/677* | (2006.01) | |

(52) U.S. Cl.
CPC ........ *H01L 21/6838* (2013.01); *B25J 15/0052* (2013.01); *B25J 15/0095* (2013.01); *B25J 15/0616* (2013.01); *H01L 21/67706* (2013.01)

(58) Field of Classification Search
CPC ............... H01L 21/6838; B25J 15/0052; B25J 15/0095; B25J 15/0616
See application file for complete search history.

(56) References Cited

U.S. PATENT DOCUMENTS

| | | | | |
|---|---|---|---|---|
| 4,651,659 A | * | 3/1987 | Bernardon | D05B 33/00 112/308 |
| 5,077,888 A | * | 1/1992 | Tokisue | B23P 19/006 29/467 |
| 6,099,056 A | * | 8/2000 | Siniaguine | H01L 21/6838 294/188 |
| 6,824,643 B2 | * | 11/2004 | Yoshimoto | H01L 21/67132 156/716 |
| 7,604,439 B2 | | 10/2009 | Yassour et al. | |
| 8,256,370 B2 | * | 9/2012 | Kitano | G03F 7/162 118/320 |
| 8,444,126 B2 | | 5/2013 | Siebert et al. | |
| 8,800,998 B2 | * | 8/2014 | Erickson | B23Q 3/088 269/21 |
| 8,808,798 B2 | * | 8/2014 | Kitano | G03F 7/162 118/320 |

(Continued)

FOREIGN PATENT DOCUMENTS

WO    WO2013100203    7/2013

OTHER PUBLICATIONS

International Search Report for PCT Application No. PCT/IL2016/050674 dated Sep. 25, 2016.

*Primary Examiner* — Gerald McClain
(74) *Attorney, Agent, or Firm* — Pearl Cohen Zedek Latzer Baratz LLP

(57) ABSTRACT

A wafer transport system includes a substantially horizontal non-contact support platform for supporting a wafer substantially horizontally at a substantially fixed vertical distance from the platform. A wafer gripping device includes wafer grippers to grip a surface of the wafer that is opposite the non-contact support platform. Each of the wafer grippers is mounted on a vertically flexible holder to enable the wafer gripper to adapt to a height of the wafer above the wafer gripping device while maintaining a substantial horizontal rigidity of the vertically flexible holder so as to prevent horizontal motion of the wafer relative to the wafer gripping device.

14 Claims, 6 Drawing Sheets

(56) References Cited

U.S. PATENT DOCUMENTS

| | | | |
|---|---|---|---|
| 8,828,186 B2* | 9/2014 | Konno | H01L 21/67011 156/707 |
| 8,991,464 B2* | 3/2015 | Konno | H01L 21/67011 156/758 |
| 9,266,686 B2* | 2/2016 | Schilp | B65G 47/911 |
| 2009/0242124 A1* | 10/2009 | Konno | H01L 21/67011 156/716 |
| 2010/0007065 A1* | 1/2010 | Reinhold | B25J 15/0052 264/511 |
| 2012/0301612 A1* | 11/2012 | Kitano | G03F 7/162 427/240 |
| 2013/0168929 A1* | 7/2013 | Erickson | B23Q 3/088 279/3 |
| 2016/0005636 A1* | 1/2016 | Ichinose | H01L 21/6838 355/30 |

* cited by examiner

WAFER GRIPPER WITH NON-CONTACT SUPPORT PLATFORM

FIELD OF THE INVENTION

The present invention relates to wafer transport. More particularly, the present invention relates to a wafer gripper for a wafer transport system.

BACKGROUND OF THE INVENTION

Precise automatic transport of objects is important in many processes that are associated with manufacturing. In particular, silicon wafers, e.g., for use in integrated circuits, may require precise automatic transport and positioning during various phases of the fabrication process. Such stages may include processing or inspection of the wafer.

SUMMARY OF THE INVENTION

There is thus provided, in accordance with an embodiment of the present invention, a wafer transport system including: a substantially horizontal non-contact support platform for supporting a wafer substantially horizontally at a substantially fixed vertical distance from the platform; and a wafer gripping device that includes one or a plurality of wafer grippers to grip a surface of the wafer that is opposite the non-contact support platform, each of the one or a plurality of wafer grippers being mounted on a vertically flexible holder to enable that wafer gripper to adapt to a height of the wafer above the wafer gripping device while maintaining a substantial horizontal rigidity of the vertically flexible holder so as to prevent horizontal motion of the wafer relative to the wafer gripping device.

Furthermore, in accordance with an embodiment of the present invention, the non-contact support platform includes a plurality of interspersed pressure and vacuum ports.

Furthermore, in accordance with an embodiment of the present invention, the non-contact support platform is configured to support the wafer from above.

Furthermore, in accordance with an embodiment of the present invention, the one or a plurality of wafer grippers are configured to grip a bottom surface of the wafer.

Furthermore, in accordance with an embodiment of the present invention, the non-contact support platform includes an access opening to enable an instrument to access the wafer.

Furthermore, in accordance with an embodiment of the present invention, the wafer gripping device is laterally translatable so as to enable lateral translation of the wafer.

Furthermore, in accordance with an embodiment of the present invention, the wafer gripping device is mounted to a longitudinal track.

Furthermore, in accordance with an embodiment of the present invention, the longitudinal track is mounted on a transverse track.

Furthermore, in accordance with an embodiment of the present invention, each wafer gripper of the one or a plurality of wafer grippers is mounted on an arm.

Furthermore, in accordance with an embodiment of the present invention, the arm includes a rigid support, the vertically flexible holder being connected to the rigid support.

Furthermore, in accordance with an embodiment of the present invention, the vertically flexible holder is configured to rest on the rigid support when the gripper is not gripping a wafer.

Furthermore, in accordance with an embodiment of the present invention, the vertically flexible holder is connected to the rigid support by a substantially horizontal hinge.

Furthermore, in accordance with an embodiment of the present invention, a wafer gripper of the one or a plurality of wafer grippers is configured to grip the wafer when suction is applied to the gripper.

There is further provided, in accordance with an embodiment of the present invention, a wafer gripping device that includes one or a plurality of wafer grippers to grip a surface of a wafer when the wafer is supported by a substantially horizontal non-contact support platform, each wafer gripper of the one or a plurality of wafer grippers being mounted on a vertically flexible holder to enable that wafer gripper to adapt to a height of the wafer above the device while maintaining a substantial horizontal rigidity of the vertically flexible holder so as to prevent horizontal motion of the wafer relative to the wafer gripping device.

Furthermore, in accordance with an embodiment of the present invention, the one or a plurality of wafer grippers are configured to grip a bottom surface of the wafer.

Furthermore, in accordance with an embodiment of the present invention, each wafer gripper of the one or a plurality of wafer grippers is mounted on an arm.

Furthermore, in accordance with an embodiment of the present invention, the arm includes a rigid support, the vertically flexible holder being connected to the rigid support and configured to rest on the rigid support when the gripper is not gripping a wafer.

Furthermore, in accordance with an embodiment of the present invention, the vertically flexible holder is connected to the rigid support by a substantially horizontal hinge.

Furthermore, in accordance with an embodiment of the present invention, a wafer gripper of the one or a plurality of wafer grippers is configured to grip the wafer when suction is applied to the gripper.

There is further provided, in accordance with an embodiment of the present invention, a method for holding a wafer, the method including: vertically supporting the wafer by a substantially horizontal non-contact support surface; and operating a wafer gripping device that includes one or a plurality of wafer grippers to grip a surface of the wafer that is opposite the non-contact support platform, each wafer gripper of the one or a plurality of wafer grippers adapting to a height of the wafer while maintaining a substantial horizontal rigidity of the vertically flexible holder so as to prevent horizontal motion of the wafer relative to the wafer gripping device.

BRIEF DESCRIPTION OF THE DRAWINGS

In order for the present invention, to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
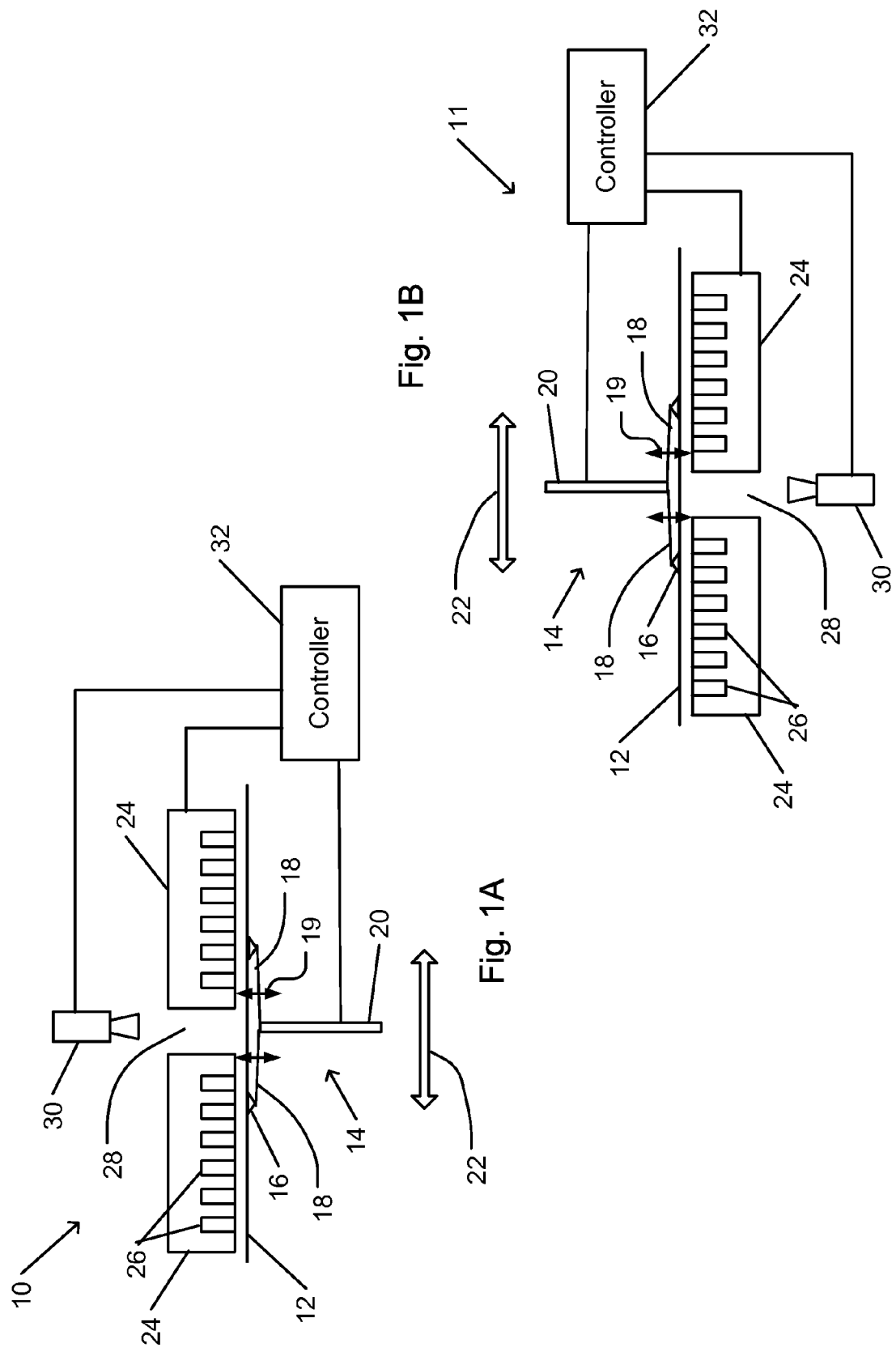
FIG. 1A schematically illustrates a wafer transport system that incorporates a wafer gripping device and a non-contact support platform for supporting a wafer from above, in accordance with an embodiment of the present invention.
FIG. 1B schematically illustrates a variant of the wafer transport system shown in FIG. 1A, in which the non-contact support platform is configured to support the wafer from below.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, us of the conjunction "or" as used herein is to be understood as inclusive (any or all of the stated options).

Some embodiments of the invention may include an article such as a computer or processor readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein.

In accordance with an embodiment of the present invention, a wafer gripping device is configured for gripping a wafer. As used herein, the term wafer refers to a silicon wafer (e.g., as suitable for fabrication into an integrated circuit) any other similar thin flat object. The wafer support is configured for use with a non-contact support platform (e.g., that includes a surface with interspersed pressure and vacuum openings). For example, the non-contact support platform may provide a fluidic spring that may hold that wafer at a precise distance from a surface of the platform.

The wafer gripping device is configured to prevent lateral motion, in a substantially horizontal plane, of the wafer. Thus, components of the wafer support that support the wafer, such as gripping arms, are configured to be substantially rigid against lateral or horizontal movement. For example, a distal end of each gripping arm may be configured to grip the wafer so as to control a lateral position of the wafer. The distal end of the gripping arm may include a suction port that grips the wafer. Alternatively or in addition, the distal end may include a clamp, clip, or other structure for gripping the wafer.

On the other hand, the components of the wafer gripping device are configured to be flexible in the vertical direction. Thus, the components may adapt to an exact vertical position (or tilt or topography) of the wafer. For example, a gripping arm may include a horizontal hinge that enables vertical rotation of a part of the gripping arm while not enabling motion in any lateral direction.

The vertical position of the wafer may be controlled by operation of a non-contact support platform. The non-contact support platform may be positioned on an opposite side of the wafer from the wafer gripping device. For example, the non-contact support platform may be positioned above the wafer. The fluidic spring effect of the non-contact support platform may thus hold the upper surface of the wafer horizontally at a fixed distance from the lower surface of the non-contact support platform. The wafer gripping device may then grip the lower surface of the wafer. As another example, the non-contact support platform may be positioned below the wafer. In this case, the wafer gripping device may be positioned to grip an upper surface of the wafer.

The vertical flexibility of the gripping arms of the device may enable the device to grip the wafer when the height of the wafer is within a predetermined range of heights. For example, the height may vary from wafer to wafer due to varying weights of different wafers or due to variations in flatness of different wafers. When the wafer gripping device grips a wafer, the wafer may be held at a fixed lateral position (e.g., as expressed by coordinates in a substantially horizontal plane). The wafer gripping device may be moved or translated laterally, e.g., along a track, to move the wafer to a different lateral position.

For example, the wafer gripping device may be configured or controlled to hold a region of the wafer within an area upon which a tool or instrument may operate. For example, the tool or instrument may measure a property of the region of the wafer. The tool or instrument may operate to modify a property of the region of the wafer. The wafer gripping device may then be laterally translated to bring another region of the wafer to the area of operation of the tool or instrument.

A wafer gripping device as described herein, and a wafer transport system that incorporates such a wafer gripping device, may be advantageous over other types of wafer gripping devices, such as wafer chucks.

In a typical wafer transport system that incorporates a chuck, operation of the chuck is responsible for determining both the horizontal and vertical position of the wafer. Thus, the chuck typically has a diameter that is greater than that of the wafer. Since the chuck is expected to hold the wafer flat, the surface of the chuck is required to itself be very flat. These requirements of vertical and horizontal stability may require a massive chuck with sufficient mechanical strength to satisfy the flatness and vertical accuracy requirements.

The massiveness of the chuck may interfere with accurate lateral or horizontal positioning of the chuck and wafer. Only the surface of the wafer that is opposite that held by the chuck is typically accessible.

On the other hand, a wafer gripping device as described herein, and incorporated within a wafer transport system that includes a non-contact support platform, need not provide vertical stability for the wafer. The wafer gripping device need only grip (e.g., using suction or a lightweight pad) a limited number of points that are distributed on the wafer surface (e.g., eight points distributed around the perimeter of a round wafer, or another number or spatial distribution of gripping points). Thus, the wafer gripping device need only have a limited number of arms with grippers (e.g., suction ports, friction pads, or other gripping structure) at their distal ends. The surface of the wafer may be accessed via an opening in the non-contact support platform, or between arms of the wafer gripping device.

In some cases, a distance between the non-contact support platform and the wafer may vary by less than one micrometer. For example, in some cases the distance may have a stability of less than ±20 nanometers and may drift by about 10 nanometers over a period of 10 seconds. The distance may have a stability of less than ±15 nanometers over a period of one second. The non-contact support platform may provide damping against shocks such that the distance may not be noticeably affected by a shuck. For some applications, the distance may be required to vary by less than ±5 nanometers over a period of 200 milliseconds. For use with many metrology systems or applications, lower stability may be acceptable.

FIG. 1A schematically illustrates a wafer transport system that incorporates a wafer gripping device and a non-contact support platform for supporting a wafer from above, in accordance with an embodiment of the present invention.

Wafer transport system 10 is configured to transport a wafer 12. For example, wafer 12 may include a silicon or other crystalline wafer for production of electronic component (e.g., integrated circuit, photovoltaic cell, or other component), or another thin flat object.

Wafer 12 may be supported by non-contact support platform 24, here shown as supporting wafer 12 from above. Non-contact support platform 24 includes a plurality of platform ports 26 that are distributed across the surface of non-contact support platform 24. For example, platform ports 26 may include interspersed pressure and vacuum ports. A pressure port of platform ports 26 may be connected to a pressure source and may expel air (or another gas or fluid). A vacuum port of platform ports 26 may be connected to a vacuum source that sucks air into the vacuum port. The effect of the interspersed pressure and vacuum ports may create the fluidic spring effect. Alternatively or in addition, non-contact support platform 24 may be based on another configuration in which pressure and vacuum create a fluidic spring effect. For example, non-contact support platform 24 may include a porous surface regions of which are connected to pressure and vacuum sources.

Wafer 12 may be laterally held in place by wafer gripping device 14. Wafer gripping device 14 includes one or more wafer grippers 16. Each wafer gripper 16 is located near a distal end of a gripper arm 18. Gripper arms 18 extend outward from a common gripping device base 20. Each gripper arm 18 is constructed to enable vertical motion of at least a part of gripper arm 18 that is adjacent to wafer gripper 16, as indicated by vertical motion 19 (as represented by a double-headed curved arrow). However, gripper arm 18 is constructed so as to be substantially horizontally or laterally rigid or stiff and not bendable or flexible in a horizontal or lateral direction (e.g., substantially parallel to the plane or surface of wafer 12). For example, the portion of gripper arm 18 that is vertically movable may be attached to an immovable (e.g., proximal) portion of gripper arm 18 by a horizontal hinge having a horizontal hinge axis.

For example, each wafer gripper 16 may be configured to grip wafer 12 by applying friction between a surface (e.g., rubber or elastic plastic surface) of wafer gripper 16 and the surface of wafer 12. Friction may be enhanced by application of suction to wafer gripper 16. For example, a surface of wafer gripper 16 that faces wafer 12 may include an opening that is connected to a suction source (e.g., a pump or blower) via one or more tubes or other conduits. The opening may be surrounded by a sealing material (e.g., a sealing ring made of rubber or an elastic plastic or gel). Application of the suction may enable ambient atmospheric press to press the surrounding sealing material to against wafer 12, thus enhancing friction forces. Alternatively or in addition, wafer gripper 16 may include mechanical (e.g., a clip, clamp, or other mechanical structure) or other structure for gripping wafer 12.

A top surface of wafer 12 may be accessed via access opening 28 in non-contact support platform 24. For example, a wafer inspection device 30 may optically or otherwise access wafer 12 via access opening 28. Wafer inspection device 30 may include one or more sensors or other devices (e.g., radiation-producing devices for producing visible or invisible electromagnetic radiation, acoustic or mechanical waves or pulses, a particle beam, or other radiation, or other devices) for enabling inspection or evaluation of a property or characteristic of a surface or interior of wafer 12.

Different parts of the top surface of wafer 12 may be accessed by laterally moving wafer 12. For example, gripping device base 20, and thus all parts of wafer gripping device 14 that are attached to gripping device base 20, may be laterally moved with lateral motion 22 (represented by a double-headed arrow). For example, gripping device base 20 may be mounted on a linear track that enables motion in one dimension. Gripping device base 20 may be mounted on a two-dimensional translation device. For example, a longitudinal linear track may be transversely translatable along two or more transverse tracks, thus enabling two-dimensional (e.g., x and y) translation of gripping device base 20. Gripping device base 20 may include, or may be mounted on, a transport device that includes, one or more motorized wheels, continuous tracks, or other motorized device to enable lateral self propulsion. Gripping device base may be mounted on a laterally rotatable mount, or may include a mechanism for laterally rotating gripper arms 18, and thus wafer 12. Thus, various parts of the top surface of wafer 12 may be sequentially or otherwise moved to a position below access opening 28, enabling sequential or other access to the various parts of wafer 12.

Alternatively or in addition to access via access opening 28, part of a bottom surface of wafer 12 may be accessible via a space between adjacent gripper arms 18.

Operation of one or more components of wafer transport system 10 may be controlled by controller 32. Controller 32 may include a single unit (e.g., housed in a single housing), or two or more separate units. The separate units may intercommunicate, or may operate independently of one another. Controller 32 may include one or more processors, processing units, computers, or other circuits or circuitry to enable control of operation of one or more components of wafer transport system 10.

Controller 32 may be configured to control operation of wafer transport system 10 in accordance with user input, e.g., by user operation of one or more controls. Alternatively or in addition, controller 32 may be configured to control operation of wafer transport system 10 in accordance with programmed instructions that are stored on one or more memory or data storage devices that are accessible by a data processing unit of controller 32. Controller 32 may be configured to operate in accordance with transmitted instructions or commands that are transmitted to controller 32 from a remote device via a communications channel or network.

Controller 32 may be configured to receive, analyze or process signals from one or more sensors. For example, the sensors may include one or more sensors of wafer inspection device 30, or other sensors (e.g., an encoder or other device for ascertaining a relative or absolute position or orientation of wafer 12, or of a component of wafer transport system 10. Controller 32 may be configured to output sensed values or results of analysis of received signals on a display screen or other output device. Controller 32 may be configured to store sensed values or analysis results in a memory or data storage device. Controller 32 may be configured to operate one or more components of wafer transport system 10 in accordance with a sensed value or in accordance with an analysis result.

For example, controller 32 may be configured to control operation of one or more of non-contact support platform 24 (e.g., operation of one or more blowers, pumps, valves, or other components of non-contact support platform 24), wafer gripping device 14 (e.g., lateral motion or rotation of wafer gripping device 14, applied suction to wafer grippers 16, or other operation of wafer grippers 16 or of wafer gripping device 14), wafer inspection device 30, a component for effecting lateral motion 22, or another component of wafer transport system 10.

FIG. 1B schematically illustrates a variant of the wafer transport system shown in FIG. 1A, in which the non-contact support platform is configured to support the wafer from below.

In bottom supported wafer transport system 11, non-contact support platform 24 supports wafer 12 from below. Wafer grippers 16 of wafer gripping device 14 may grip wafer 12 from above to prevent lateral motion of, or to laterally translate or rotate, wafer 12. Wafer inspection device 30 may inspect the bottom surface of wafer 12 via access opening 28 in non-contact support platform 24.

For example, a wafer inspection facility may include both a wafer transport system 10 and a bottom supported wafer transport system 11. A wafer 12 may be transferred from one to the other of wafer transport system 10 and bottom supported wafer transport system 11 to enable inspection of both the top and bottom sides of that wafer 12. Alternatively or in addition, a wafer inspection facility may include a device for flipping a wafer 12. In this case, wafer transport system 10 or bottom supported wafer transport system 11 may be used to inspect both sides of a single wafer 12.

Figure 2:
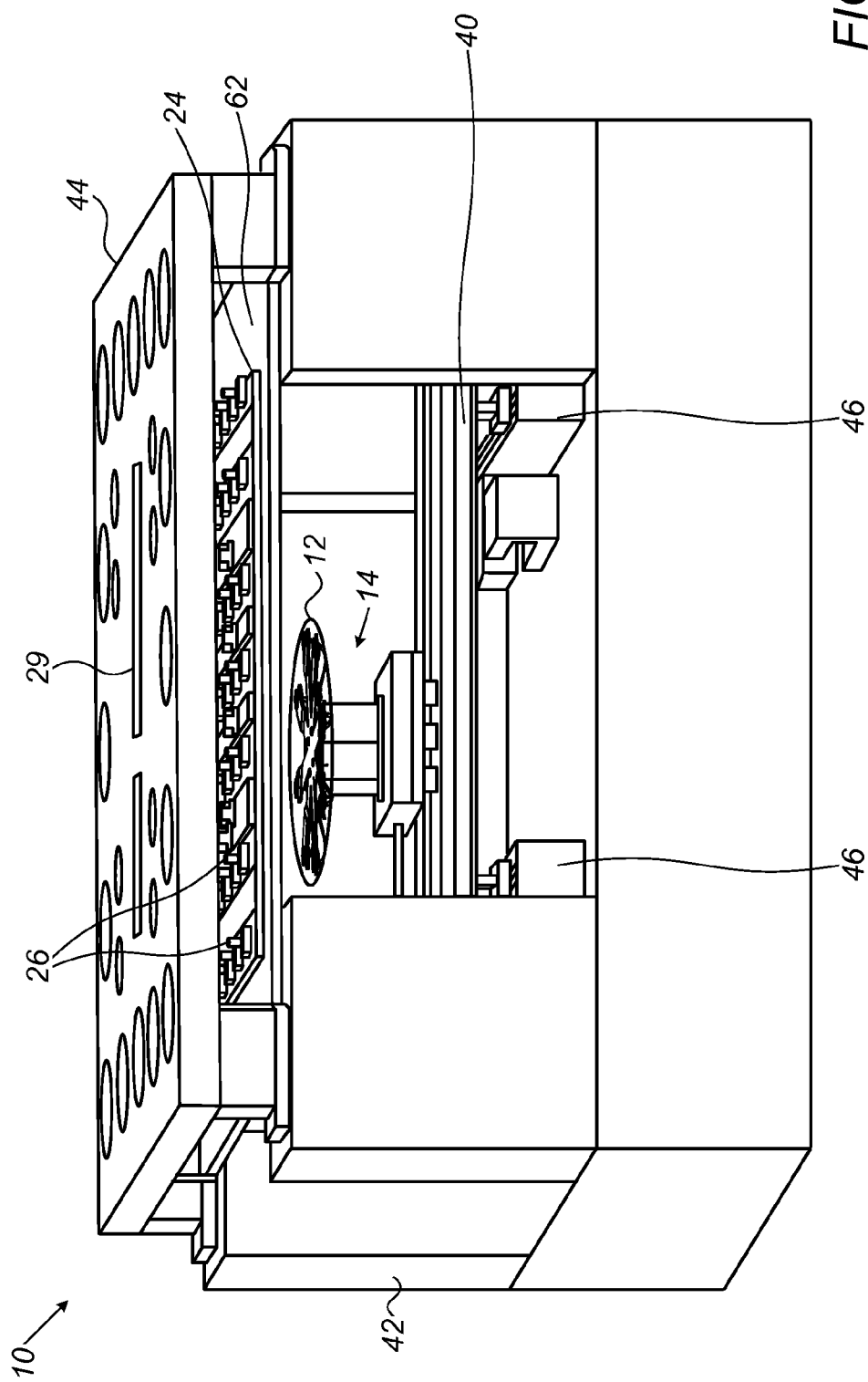
FIG. 2 schematically illustrates a wafer transport system, in accordance with an embodiment of the present invention.

FIG. 2 schematically illustrates a wafer transport system, in accordance with an embodiment of the present invention.

Wafer transport system 10 is configured to prevent, damp, or otherwise reduce or minimize vibration of wafer 12. For example, all components of wafer transport system 10 may be supported by an isolation base 42, or other structure (e.g., mechanically isolated structure), that is configured to minimize vibration. For example, isolation base 42 may be constructed of a dense material such as granite.

Non-contact support platform 24 may be mounted to isolation base 42 via mounting plate 62. Similarly, transverse wafer transport tracks 46 are mounted to isolation base 42. Longitudinal wafer transport track 40 is, in turn, mounted on transverse wafer transport tracks 46. The mounting of longitudinal wafer transport track 40 to transverse wafer transport tracks 46, of transverse wafer transport tracks 46 to isolation base 42, or both, may include shock- or vibration-absorbing structure.

Longitudinal wafer transport track 40 and transverse wafer transport tracks 46 may be operated to laterally translate wafer gripping device 14, and thus wafer 12, with a two-dimensional motion within a plane. The vertical position of wafer 12 is determined by operation of non-contact support platform 24.

Interface plate 44 enables interfacing components of wafer transport system 10 with various external components. For example, interface plate 44 enables connection of each platform port 26 to a pressure or vacuum source. Instrument interface 29 enables mounting or connection of a metrology or other tool or instrument. Instrument interface 29 may enable positioning the instrument opposite access opening 28 (FIG. 5) in non-contact platform 24.

Figure 3:
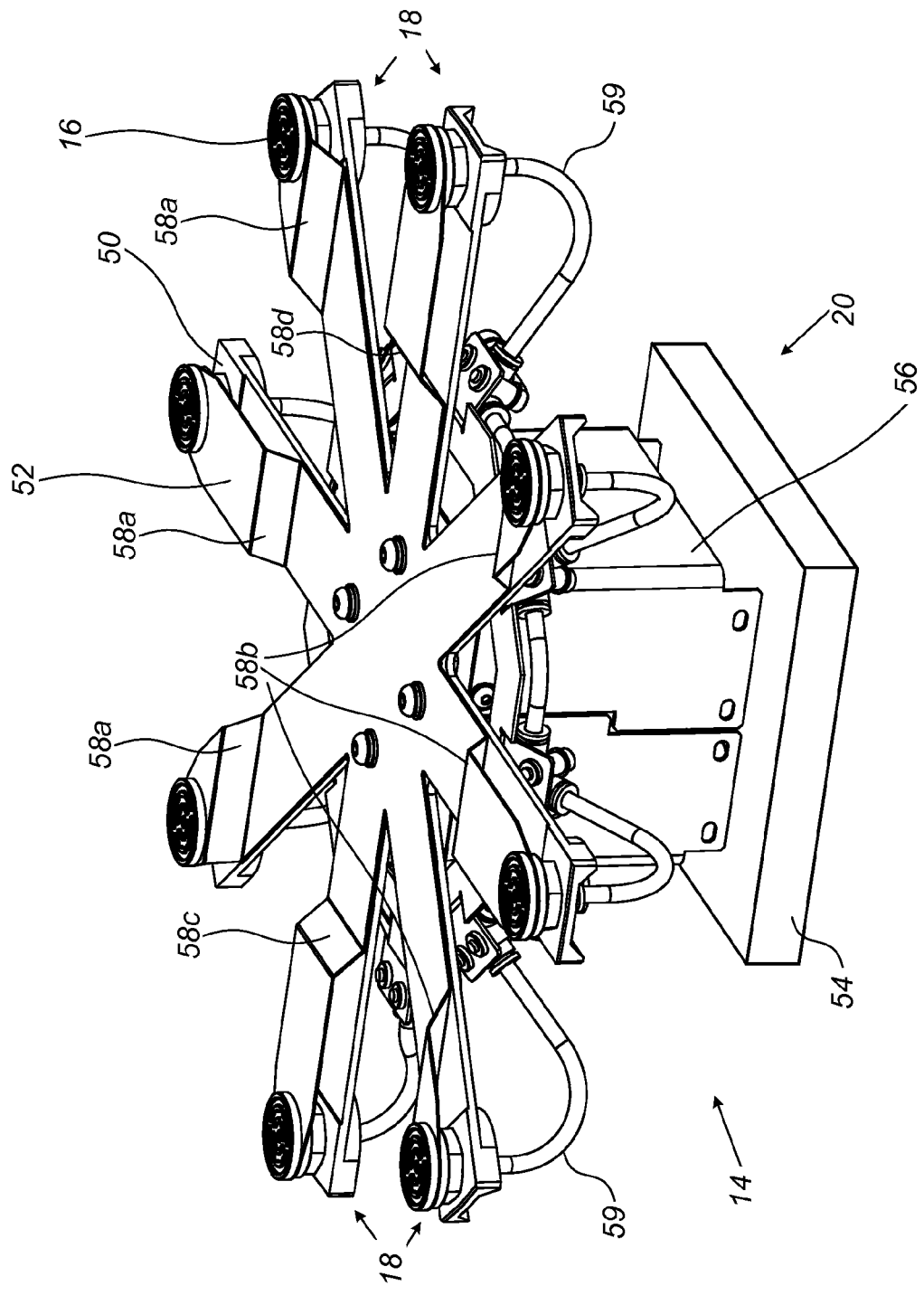
FIG. 3 schematically illustrates a wafer gripping device of the wafer transport system shown in FIG. 2.

FIG. 3 schematically illustrates a wafer gripping device of the wafer transport system shown in FIG. 2.

Wafer gripping device 14 includes a plurality (e.g., eight, or another number) of wafer grippers 16. Each wafer gripper 16 is located at a distal end of a gripper arm 18. In the example shown, each wafer gripper 16 includes a pad to which suction may be applied. For example, the suction may be applied by a suction-producing blower or pump that is located in base column 56 of gripping device base 20, or elsewhere in wafer transport system 10. The suction that is produced by the blower or pump may be applied to each wafer gripper 16 via a suction hose 59. For example, suction hose 59 may be flexible to enable continued application of suction to wafer gripper 16 when wafer gripper 16 moves upward or downward. Gripper arm 18 may include one or more tubes or other conduits via which the suction is applied to wafer gripper 16. A part of wafer gripper 16 that is brought into contact with a wafer being gripped may include a flexible or elastic material that serves to form a (temporary) seal between wafer gripper 16 and the wafer being gripped.

In the example shown, each gripper arm 18 includes a rigid support 50. A gripper holder 52 extends from each rigid support 50. Each wafer gripper 16 is mounted on a gripper holder 52. Gripper holder 52 is configured to be vertically flexible. For example, rigid support 50 may support gripper holder 52 (e.g., gripper holder 52 may rest on rigid support 50) in an approximately horizontal position when wafer gripper 16 is not gripping a wafer. The vertical flexibility of gripper holder 52 enables the wafer gripper 16 to move upward from rigid support 50 to grip (by applied suction) a wafer that is hovering above that wafer gripper 16. The structure of gripper holder 52 is such as to not enable lateral motion or bending of gripper holder 52 relative to rigid support 50.

For example, a gripper holder 52 may be connected to rigid support 50 at a horizontal hinge 58a-58d. The horizontal hinge 58a-58d may enable gripper holder 52 and its attached wafer gripper 16 to rotate upward about the axis of its corresponding horizontal hinge 58a-58d. On the other hand, no rotation of gripper holder 52 is possible in a plane that includes the axis of the corresponding horizontal hinge 58a-58d.

In the example shown, the axes of horizontal hinges 58a are collinear with one another. Similarly, the axes of horizontal hinges 58b are collinear with one another and parallel to the axes of horizontal hinges 58*a*. The axes of horizontal hinges 58*c* and 58*d* are parallel to one another and perpendicular to the axes of horizontal hinges 58*a* and 58*b*.

Other mechanisms for providing a gripper arm 18 with vertical flexibility are possible. For example, a distal end of each gripper arm may be connected by a vertical hinge to a proximal section of the gripper arm. The hinge may be configured to enable upward rotation, but not downward rotation. As another example, a gripper arm may be made of linked sections such that each linked section is upwardly rotatable relatively to a proximal adjacent linked section. Another suitable mechanism for upward flexibility may be provided.

In the case of a wafer gripping device 14 that is configured for gripping an upper surface of a wafer, a mechanism for downward flexing or bending of a gripper arm 18 may be provided. For example, a holding mechanism may be provided to hold a gripper arm 18 in a substantially horizontal configuration until suction force of a wafer gripper 16 on a wafer surface overcomes the force of the holding mechanism, or the holding mechanism is released (e.g., by a controller). Another suitable mechanism for downward flexibility may be provided.

Gripping device base 20 may include an attachment plate 54. Attachment plate 54 may be configured for attachment to a suitable lateral transport mechanism. For example, attachment plate 54 may attach to longitudinal wafer transport track 40.

In some cases, base column 56 of gripping device base 20 may include a mechanism for rotating gripper arms 18 in tandem.

Figure 4:
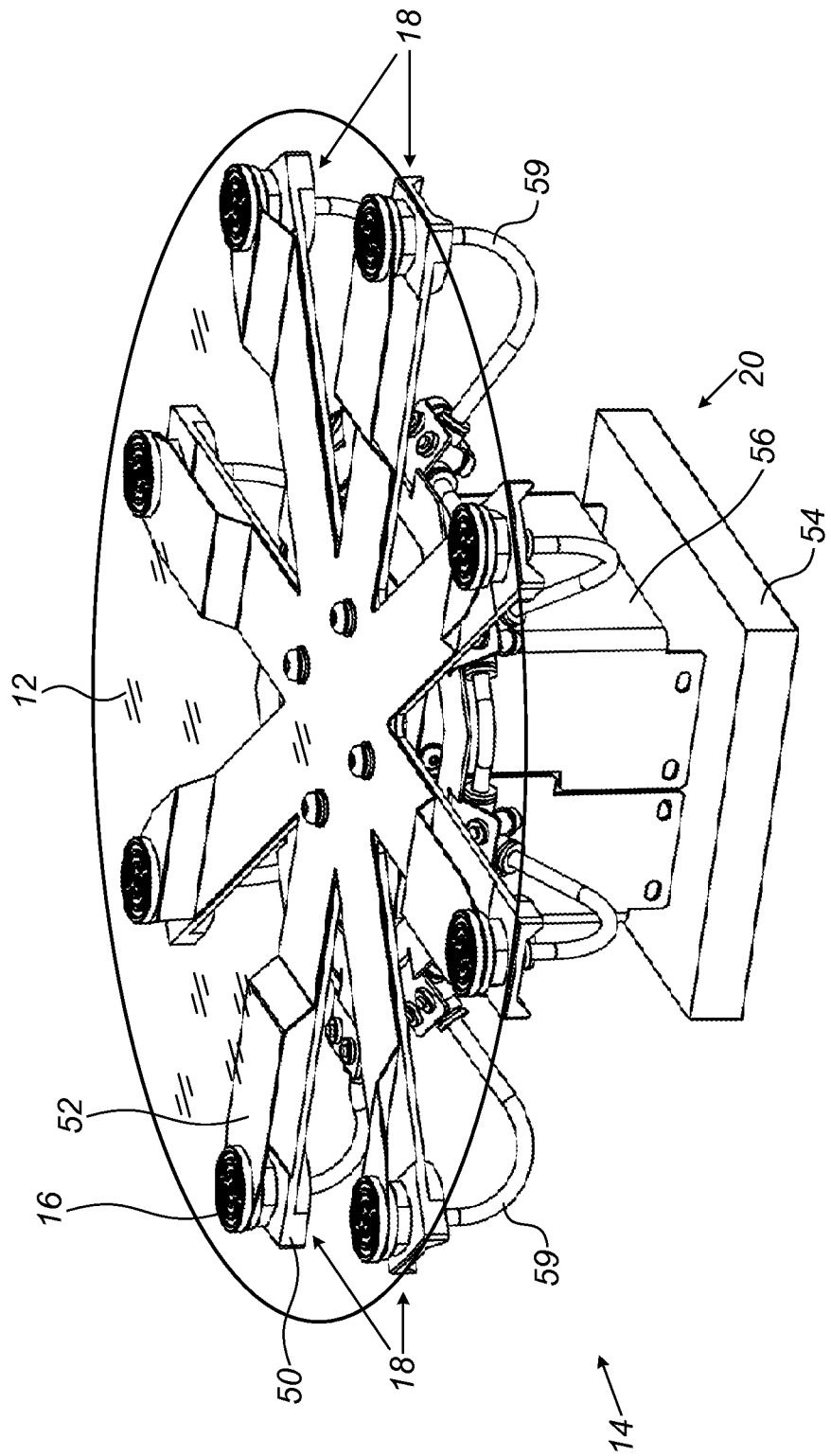
FIG. 4 schematically illustrates the wafer gripping device of FIG. 3 when gripping a wafer.

FIG. 4 schematically illustrates the wafer gripping device of FIG. 3 when gripping a wafer.

Wafer grippers 16 at distal ends of gripper arms 18 are each gripping wafer 12. Wafer 12 may be held at a vertical position by a non-contact support platform, e.g., above wafer gripping device 14. For example, one or more of gripper holders 52 may have bent upward with respect to its corresponding rigid support 50 to enable wafer gripper 16 to grip wafer 12. Thus, wafer 12 is held laterally stationary with respect to gripping device base 20 while it is held vertically stationary by the non-contact support platform.

Gripper arms 18 may be laterally translated or rotated in tandem in order to laterally translate or rotate wafer 12.

Figure 5:
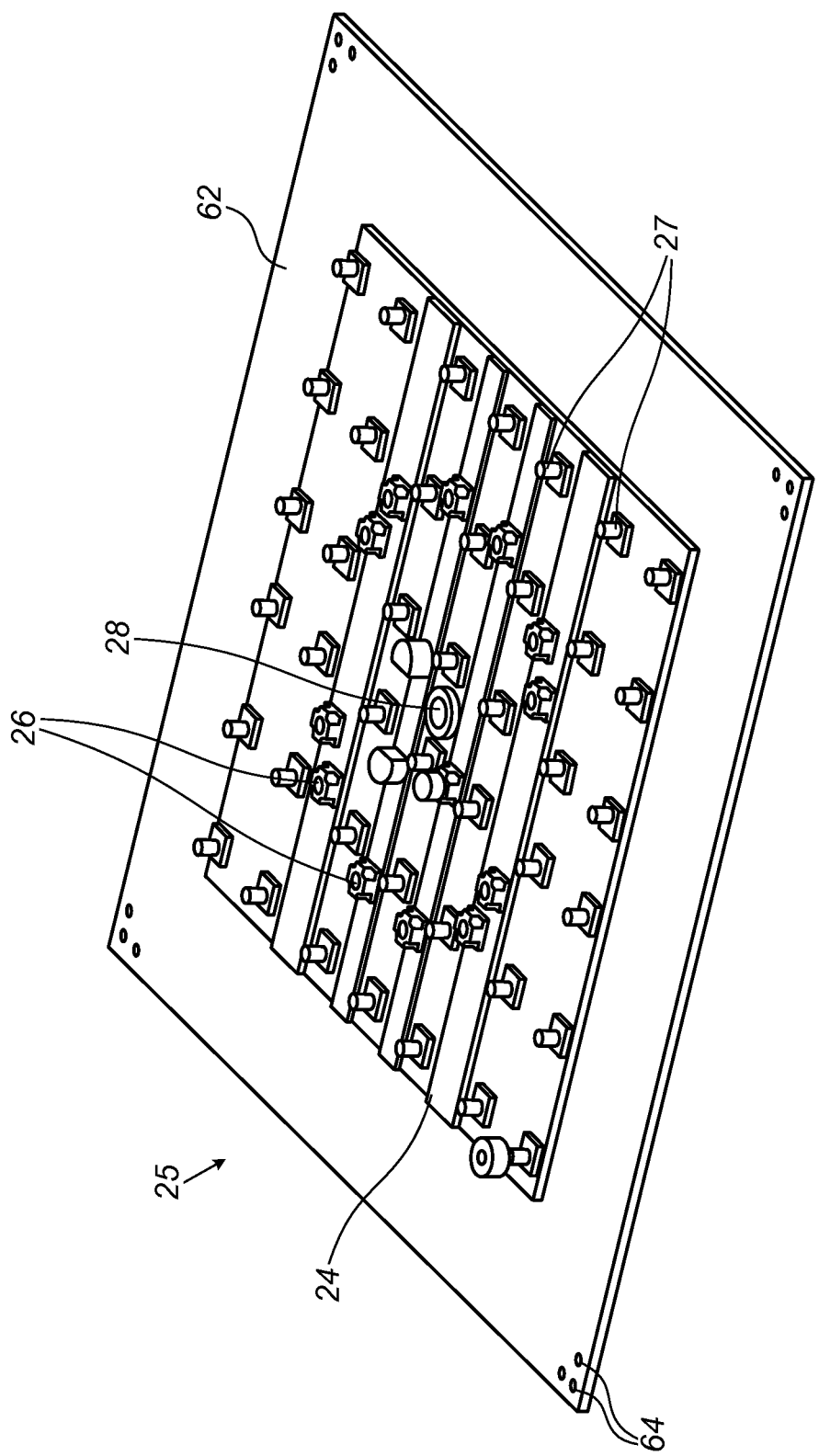
FIG. 5 schematically illustrates a non-contact support platform assembly of the wafer transport system shown in FIG. 2.

FIG. 5 schematically illustrates a non-contact support platform assembly of the wafer transport system shown in FIG. 2.

In non-contact support platform assembly 25, non-contact support platform 24 is mounted on mounting plate 62 using mount interfaces 27. For example, mount interfaces 27 may include bolts or screws for mounting non-contact support platform 24 on mounting plate 62 with an adjustable relative slope (e.g., to compensate for any unevenness or slope). Mounting plate 62 may include mounting structure 64 for mounting non-contact support platform assembly 25 within a support structure of a wafer transport system. For example, mounting structure 64 may include holes or slots through which a mounting screw, bolt, pin, clip, or other mounting component may be inserted. The support structure may include corresponding structure that enables mounting or fixing of mounting plate 62 to the support structure. For example, the support structure may include isolation base 42 (FIG. 2), or another type of support structure.

Non-contact support platform 24 includes platform ports 26. Each platform port 26 may be connected (e.g., via interface plate 44) to a pressure or vacuum source. Non-contact support platform 24 may be operated to stably support a wafer at a fixed distance from non-contact support platform 24.

Non-contact support platform 24 includes access opening 28. Access opening 28 may enable a metrology, inspection, or other instrument or tool to access a wafer that is supported by non-contact platform 24.

Figure 6:
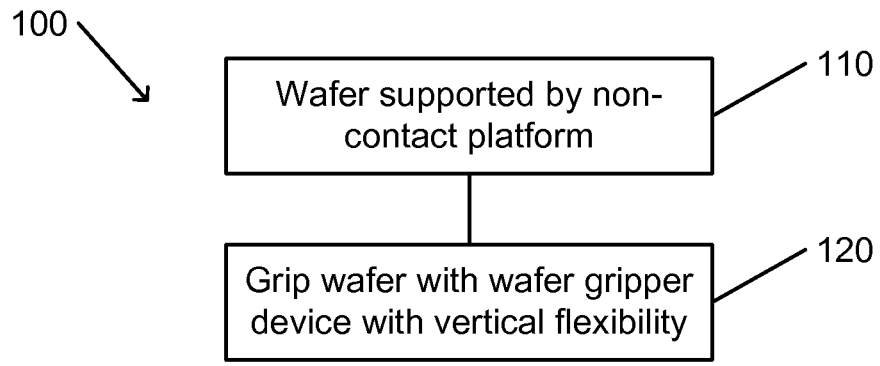
FIG. 6 is a flowchart depicting a method for holding a wafer by a wafer transport system, in accordance with an embodiment of the present invention.

FIG. 6 is a flowchart depicting a method for holding a wafer by a wafer transport system, in accordance with an embodiment of the present invention.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Some or all operations of wafer holding method 100 may be performed automatically by a wafer transport system, by a human operator who is operating the wafer transport system, or both.

The wafer is supported by a non-contact platform (block 110). For example, the wafer transport system may be provided with a feeding mechanism that places a wafer in the vicinity (e.g., below or above) of the non-contact platform. Alternatively or in addition, a wafer may be manually placed in the vicinity of the non-contact platform or another wafer transport system may deliver a wafer to the vicinity of the non-contact platform. Concurrently, the non-contact platform may be operated by providing fluid (e.g., gaseous) pressure and vacuum to interspersed ports of the non-contact platform. The non-contact platform may thus support the wafer at a fixed vertical position relative to the non-contact platform (e.g., with a predetermined precision or stability).

The wafer may be gripped by a wafer gripper device having vertical flexibility (block 120). For example, the wafer gripper device may be moved, or may be originally positioned, near a side of the wafer opposite the non-contact platform. Suction may be applied to wafer grippers of the device to grip the wafer. For example, when the wafer gripper device is positioned below the wafer, the wafer grippers may be upwardly flexible such that the wafer grippers may ascend to grip the bottom surface of the wafer.

After the wafer grippers grip the wafer, the lateral position of the wafer may be fixed relative to the wafer gripper device.

Figure 7:
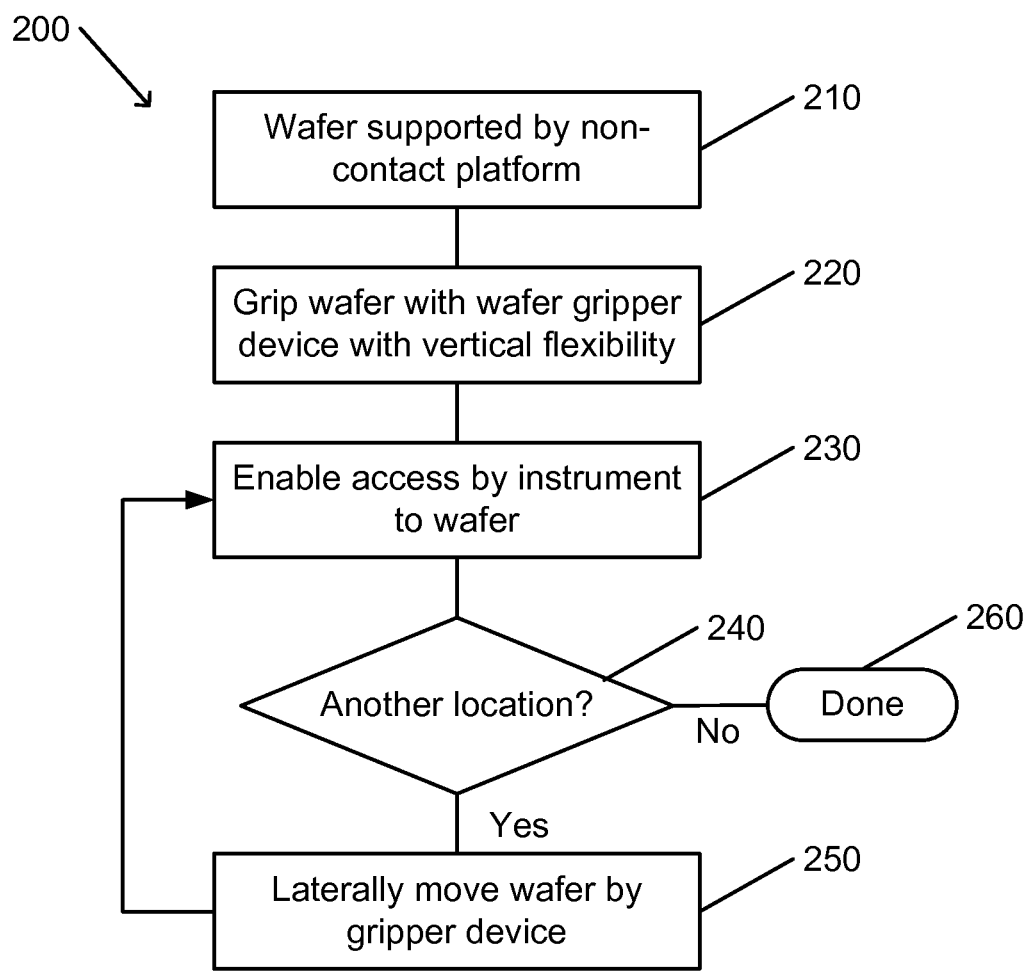
FIG. 7 is a flowchart depicting a method for operation of a wafer transport system, in accordance with an embodiment of the present invention.

FIG. 7 is a flowchart depicting a method for operation of a wafer transport system, in accordance with an embodiment of the present invention.

Some or all operations of wafer transport system operation method 200 may be performed automatically by a wafer transport system, by a human operator who is operating the wafer transport system, or both.

The wafer is supported by a non-contact platform (block 210). The non-contact platform may be operated by providing pressure and vacuum to interspersed ports of the non-contact platform. The non-contact platform may thus support the wafer at a fixed vertical position relative to the non-contact platform.

The wafer may be gripped by a wafer gripper device having vertical flexibility (block 220). For example, suction may be applied to wafer grippers of the device to grip the wafer. For example, when the wafer gripper device is positioned below the wafer, the wafer grippers may be upwardly flexible such that the wafer grippers may ascend to the bottom surface of the wafer.

Access by an instrument to the wafer may be enabled (block 230). For example, a region of a surface of the wafer to which an instrument is to be applied may be held by the wafer gripper device opposite an access opening in the non-contact platform. The instrument may be configured to inspect, measure, modify, or otherwise interact with the region of the wafer surface.

Access by the instrument to another region of the wafer surface may be required or desired (block 240). For example, another region of the wafer surface may be inspected, measured, or modified.

If so, then the wafer transport system may be operated to laterally move the wafer by the wafer gripping mechanism (block 250). For example, the wafer gripper device may be laterally translated by an appropriate lateral translation mechanism (e.g., by mutually perpendicular linear tracks). The wafer gripper device may be configured to laterally translate the wafer (e.g., if an upper part of the wafer gripper device is configured to be laterally translated with respect to a lower part). The wafer gripper device may be laterally rotated, or the wafer gripper device may be configured to laterally rotate the wafer.

The lateral motion may enable access by an instrument to another region of the wafer (returning to block 230). The other region may be deterministically, randomly, or otherwise selected.

When access to no other regions of the wafer is required or desired, performance of wafer transport system operation method 200 may end (block 260). For example, the wafer may be ejected or removed from the wafer transport system, may be transported to a predetermined location, may be transferred to another wafer transport system, may be flipped over to enable access to another side of the wafer, or otherwise treated.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A wafer gripping device that includes one or a plurality of wafer grippers to grip a bottom surface of a wafer when suction is applied to the gripper and when the wafer is supported from above by a substantially horizontal non-contact support platform that includes a plurality of interspersed pressure and vacuum ports, each wafer gripper of said one or a plurality of wafer grippers being mounted on a vertically flexible holder to enable that wafer gripper to adapt to a height of the wafer above the device while maintaining a substantial horizontal rigidity of the vertically flexible holder so as to prevent horizontal motion of the wafer relative to the wafer gripping device.

2. The device of claim 1, wherein each wafer gripper of said one or a plurality of wafer grippers is mounted on an arm.

3. The device of claim 2, wherein the arm comprises a rigid support, the vertically flexible holder being connected to the rigid support and configured to rest on the rigid support when the gripper is not gripping a wafer.

4. The device of claim 3, wherein the vertically flexible holder is connected to the rigid support by a substantially horizontal hinge.

5. A wafer transport system comprising:
   a substantially horizontal non-contact support platform for supporting a wafer substantially horizontally and from above at a substantially fixed vertical distance from the platform, the platform including a plurality of interspersed pressure and vacuum ports; and
   a wafer gripping device that includes one or a plurality of wafer grippers to grip a bottom surface of the wafer that is opposite the non-contact support platform when suction is applied to the gripper, each of said one or a plurality of wafer grippers being mounted on a vertically flexible holder to enable that wafer gripper to adapt to a height of the wafer above the wafer gripping device while maintaining a substantial horizontal rigidity of the vertically flexible holder so as to prevent horizontal motion of the wafer relative to the wafer gripping device.

6. The system of claim 5, wherein the wafer gripping device is laterally translatable so as to enable lateral translation of the wafer.

7. The system of claim 6, wherein the wafer gripping device is mounted to a longitudinal track.

8. The system of claim 7, wherein the longitudinal track is mounted on a transverse track.

9. The system of claim 5, wherein each wafer gripper of said one or a plurality of wafer grippers is mounted on an arm.

10. The system of claim 9, wherein the arm comprises a rigid support, the vertically flexible holder being connected to the rigid support.

11. The system of claim 10, wherein the vertically flexible holder is configured to rest on the rigid support when the gripper is not gripping a wafer.

12. The system of claim 10, wherein the vertically flexible holder is connected to the rigid support by a substantially horizontal hinge.

13. The system of claim 5, wherein the non-contact support platform comprises an access opening to enable an instrument to access the wafer.

14. A method for holding a wafer the method comprising:
   vertically supporting the wafer from above by a substantially horizontal non-contact support surface that includes a plurality of interspersed pressure and vacuum ports; and applying suction to a wafer gripping device that includes one or a plurality of wafer grippers to grip a bottom surface of the wafer that is opposite the non-contact support platform, each wafer gripper of said one or a plurality of wafer grippers adapting to a height of the wafer while maintaining a substantial horizontal rigidity of the vertically flexible holder so as to prevent horizontal motion of the wafer relative to the wafer gripping device.

* * * * *